United States Patent
Obinata (10) Patent No.: US 12,334,411 B2
(45) Date of Patent: Jun. 17, 2025

(54) SEMICONDUCTOR PACKAGE

(71) Applicant: NGK SPARK PLUG CO., LTD., Nagoya (JP)

(72) Inventor: Kenji Obinata, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 482 days.

(21) Appl. No.: 17/708,770

(22) Filed: Mar. 30, 2022

(65) Prior Publication Data

US 2022/0319947 A1    Oct. 6, 2022

(30) Foreign Application Priority Data

Apr. 1, 2021   (JP) ................... 2021-062494

(51) Int. Cl.
*H01L 23/367*    (2006.01)
*H01L 23/373*    (2006.01)

(52) U.S. Cl.
CPC ........ *H01L 23/367* (2013.01); *H01L 23/3736* (2013.01)

(58) Field of Classification Search
CPC .................................................. H01L 23/367
See application file for complete search history.

(56) References Cited

U.S. PATENT DOCUMENTS

| | | | | |
|---|---|---|---|---|
| 6,130,477 A * | 10/2000 | Chen | ............... | H01L 24/50 |
| | | | | 257/E23.101 |
| 8,014,152 B2 * | 9/2011 | Nishiuma | ............ | H05K 7/20481 |
| | | | | 257/796 |
| 8,164,182 B2 * | 4/2012 | Ong | ............... | H01L 23/3128 |
| | | | | 257/E23.101 |
| 10,504,813 B2 * | 12/2019 | Davare | ............... | H05K 1/0206 |
| 10,681,801 B2 * | 6/2020 | Kotlar | ............... | H05K 1/0204 |
| 2007/0018310 A1 * | 1/2007 | Sato | ............... | H01L 23/3675 |
| | | | | 257/E23.092 |
| 2012/0326292 A1 * | 12/2012 | Ohashi | ............... | H01L 23/3677 |
| | | | | 257/690 |
| 2022/0210942 A1 * | 6/2022 | Miyake | ............... | H05K 7/205 |

FOREIGN PATENT DOCUMENTS

| | | |
|---|---|---|
| JP | 2007-266172 A | 10/2007 |
| JP | 2007-311510 A | 11/2007 |

* cited by examiner

*Primary Examiner* — Mark W Tornow
(74) *Attorney, Agent, or Firm* — Stites & Harbison, PLLC; Jeffrey A. Haeberlin (57) ABSTRACT

A semiconductor package includes a substrate body made of an insulating material and having a frame shape with a through hole; and a heat-dissipating member made of a metallic material and having a top face serving as an element-mounting surface, the element-mounting surface being positioned in the through hole. A back face of the substrate body and a front face of the heat-dissipating member are joined to each other with a joining agent, the back face being oriented downward, the front face being oriented upward. The substrate body includes a first riser portion extending downward from the back face. The heat-dissipating member includes a second riser portion extending upward from the front face. The joining agent is placed in a space enclosed by the back face, the first riser portion, the front face, and the second riser portion.

8 Claims, 11 Drawing Sheets

SEMICONDUCTOR PACKAGE

CROSS REFERENCE TO RELATED APPLICATIONS

The present application claims priority based on Japanese Patent Application No. 2021-062494, filed Apr. 1, 2021. The disclosure of this application is incorporated herein by reference in its entirety.

BACKGROUND OF THE INVENTION

1. Field of the Invention

The present disclosure relates to a semiconductor package.

2. Description of the Related Art

A known semiconductor package includes a frame-shaped substrate body made of an insulating material, and a heat-dissipating member made of a metallic material and mated to the substrate body in such a manner as to support a semiconductor (see Japanese Unexamined Patent Application Publication No. 2007-311510, for example). Typically, the substrate body and the heat-dissipating member of such a semiconductor package are joined to each other with a joining agent such as filler metal or adhesive.

In the case where the substrate body and the heat-dissipating member are joined to each other with a joining agent such as filler metal or adhesive, the joining agent is melted in the joining process and spreads over the joining surfaces of the substrate body and the heat-dissipating member. The melted joining agent may leak to a front or back face of the semiconductor package. If the joining agent leaked to the front or back face of the semiconductor package reaches any location near, for example, an area where the semiconductor is to be mounted or an area where the semiconductor package is to be connected to a motherboard, an unfavorable incident may occur. In this respect, there has been a demand for a technique of reducing or preventing the leakage of the joining agent.

SUMMARY OF THE INVENTION

According to one aspect of the present invention, a semiconductor package includes a substrate body made of an insulating material and having a frame shape with a through hole; and a heat-dissipating member made of a metallic material and having a top face serving as an element-mounting surface, the element-mounting surface being positioned in the through hole. A back face of the substrate body and a front face of the heat-dissipating member are joined to each other with a joining agent, the back face being oriented downward, the front face being oriented upward. In the semiconductor package, the substrate body includes a first riser portion extending downward from the back face, the heat-dissipating member includes a second riser portion extending upward from the front face, and the joining agent is placed in a space enclosed by the back face, the first riser portion, the front face, and the second riser portion.

In the semiconductor package according to the above aspect, the back face of the substrate body has the first riser portion, the front face of the heat-dissipating member has the second riser portion, and the joining agent is placed in the space defined by the back face of the substrate body, the first riser portion, the front face of the heat-dissipating member, and the second riser portion. Therefore, the joining agent melted with heat is allowed to spread within the above space, which reduces the probability that the melted joining agent may spread into other areas between the substrate body and the heat-dissipating member. Consequently, the probability that the melted joining agent may leak to the front or back face of the semiconductor package is reduced.

An inner lateral face of the substrate body and an outer lateral face of the heat-dissipating member that are positioned face to face with each other may be spaced apart from each other. Such a configuration reduces the probability that the lateral face of the substrate body and the lateral face of the heat-dissipating member may come into contact with each other when the substrate body and the heat-dissipating member undergo thermal expansion in the joining process in which the joining agent is heated. Consequently, the probability of an unfavorable incident due to a stress generated between the substrate body and the heat-dissipating member that may come into contact with each other is reduced.

The joining agent may be filler metal. In such a configuration, before the substrate body and the heat-dissipating member are joined to each other and when the substrate body and the heat-dissipating member are mated to each other with the joining agent being placed in the space enclosed by the back face of the substrate body, the first riser portion, the front face of the heat-dissipating member, and the second riser portion, the joining agent is held between the first riser portion and the second riser portion. Therefore, the substrate body and the heat-dissipating member are accurately positioned with respect to each other.

The substrate body may be made of alumina, and the heat-dissipating member may be made of copper. Such a configuration enhances the effect of reducing the probability of leakage of the melted joining agent to the front or back face of the semiconductor package while maintaining the performance of the semiconductor package.

The present disclosure may be implemented by any of various aspects other than those described above: for example, a method of manufacturing a semiconductor package or a method of positioning members included in a semiconductor package.

DESCRIPTION OF THE PREFERRED EMBODIMENTS

A. First Embodiment (A-1) Overall Configuration of Semiconductor Package

Figure 1:
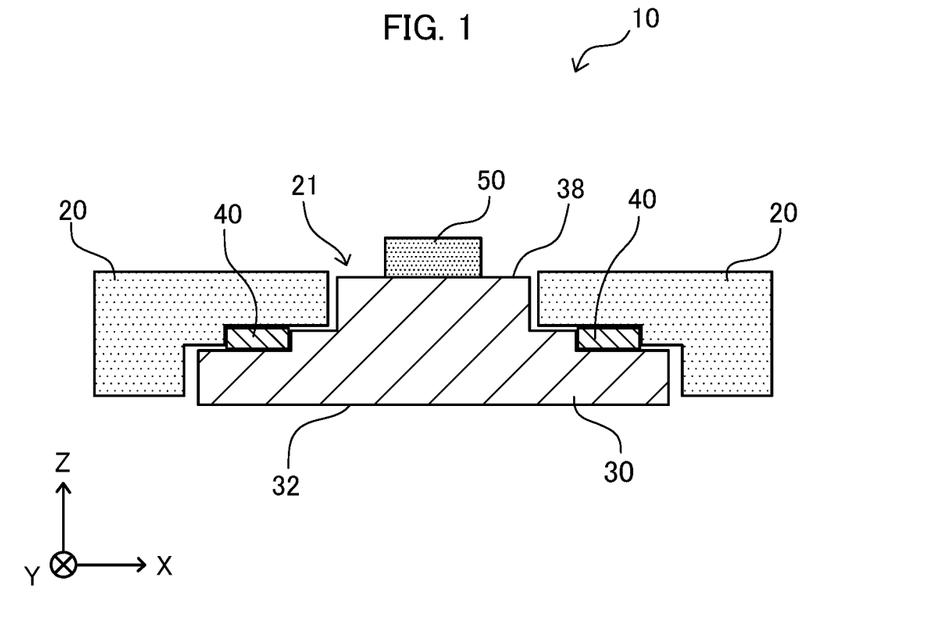
FIG. 1 is a sectional view of a semiconductor package according to a first embodiment, schematically illustrating a configuration thereof.
Figure 2:
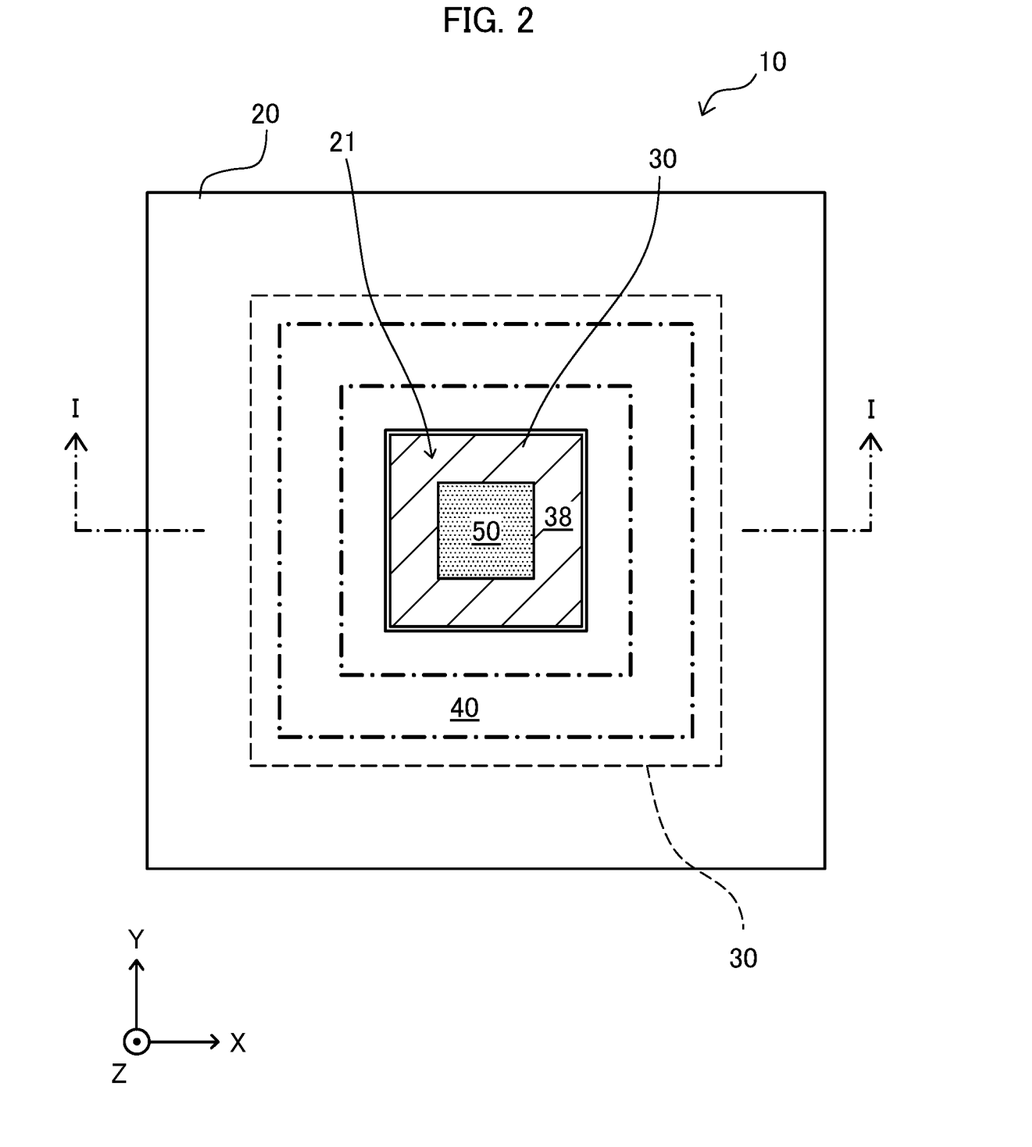
FIG. 2 is a plan view of the semiconductor package according to the first embodiment, schematically illustrating an appearance thereof.

FIG. 1 is a sectional view of a semiconductor package 10 according to a first embodiment, schematically illustrating a configuration thereof. FIG. 2 is a plan view of the semiconductor package 10, schematically illustrating an appearance thereof. The section illustrated in FIG. 1 is taken along line I-I illustrated in FIG. 2. The drawings including FIGS. 1 and 2 are each provided with X, Y, and Z axes that are orthogonal to one another and define respective directions. The directions represented by the X, Y, and Z axes are consistent throughout the drawings. In this specification, the Z axis represents the vertical direction, and the X axis and the Y axis represent respective horizontal directions. These vertical and horizontal directions are defined only for the convenience of description and do not necessarily need to coincide with the directions defined when the semiconductor package 10 is actually installed. The drawings illustrate the arrangement of relevant members only schematically and are not to scale.

The semiconductor package 10 includes a substrate body 20, a heat-dissipating member 30, a joining agent 40, and a semiconductor 50. Hereinafter, regarding any member that extends in an X-Y plane, a face of that member that is on the +Z side (the upper side in the vertical direction) is also referred to as a "front face," and a face of that member that is on the -Z side (the lower side in the vertical direction) is also referred to as a "back face."

The substrate body 20 is made of an insulating material and has a rectangular frame shape with a through hole 21, which is provided in a central part of the substrate body 20 in top view. Specifically, the substrate body 20 may be made of a ceramic material such as aluminum oxide ($Al_2O_3$: alumina), aluminum nitride, boron nitride, silicon nitride, beryllium-oxide (BeO: beryllia), or glass; or resin material. Ceramic materials have high heat resistance and high strength and are therefore desirable as the material for the substrate body 20. Among the above ceramic materials, alumina is particularly desirable because it is relatively inexpensive and easily available.

Figure 3:
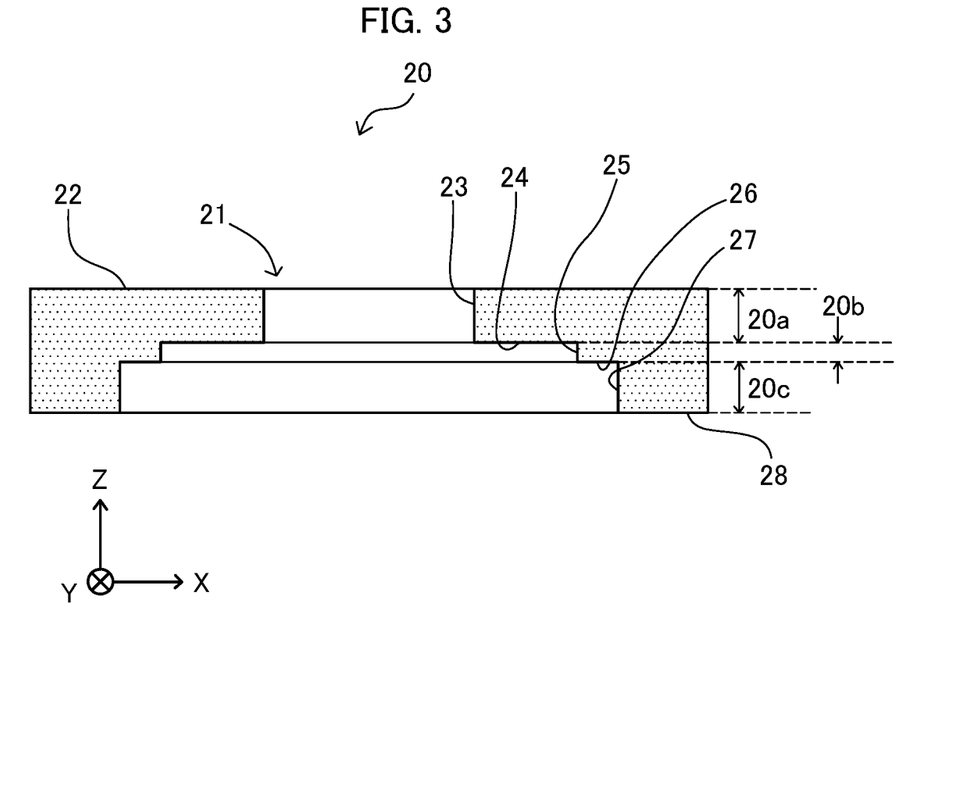
FIG. 3 is a sectional view of a substrate body, schematically illustrating a configuration thereof.

FIG. 3 is a sectional view of the substrate body 20, schematically illustrating a configuration thereof in the same section as in FIG. 1. The substrate body 20 includes three layers: a first substrate layer 20a, a second substrate layer 20b, and a third substrate layer 20c, which are stacked one on top of another in the listed order in the -Z direction. The three layers each extend horizontally (in an X-Y plane) and have a rectangular frame shape in top view. The three layers have the same outline shape and are stacked such that the outlines thereof coincide with one another in top view. The three layers have respective through holes that are of different sizes in respective central parts thereof. The through hole of the first substrate layer 20a is the smallest. The through hole of the third substrate layer 20c is the largest. The through holes of the three layers are concentric in top view. The through hole 21 of the semiconductor package 10 in top view corresponds to the through hole of the first substrate layer 20a.

The first substrate layer 20a includes a substrate front face 22, an inner peripheral face 23, and a first planar portion 24. The substrate front face 22 extends in an X-Y plane and forms the front face of the substrate body 20. The inner peripheral face 23 extends in the Z direction and forms an inner peripheral wall, i.e., a wall on the center side, of the first substrate layer 20a. The first planar portion 24 extends in an X-Y plane and forms the back face of the first substrate layer 20a on the -Z side. The second substrate layer 20b includes a riser portion 25 and a second planar portion 26. The riser portion 25 extends in the Z direction and forms an inner peripheral wall, i.e., a wall on the center side, of the second substrate layer 20b. The second planar portion 26 extends in an X-Y plane and forms the back face of the second substrate layer 20b on the -Z side. The third substrate layer 20c includes a riser portion 27 and a substrate bottom face 28. The riser portion 27 extends in the Z direction and forms an inner peripheral wall, i.e., a wall on the center side, of the third substrate layer 20c. The substrate bottom face 28 extends in an X-Y plane and forms the back face of the third substrate layer 20c on the -Z side. The inner peripheral face 23, the first planar portion 24, the riser portion 25, the second planar portion 26, and the riser portion 27 are connected to one another in the listed order and thus define the through hole 21 of the substrate body 20. The riser portion 25 extends downward (in the -Z direction) from the first planar portion 24, i.e., the back face of the substrate body 20, and is also referred to as "first riser portion".

The heat-dissipating member 30 is made of a metallic material and is a plate-like member having a rectangular shape in top view while projecting toward the +Z side. In FIG. 2, the outline of the heat-dissipating member 30 is illustrated by a broken line. As illustrated in FIG. 1, the top face of the heat-dissipating member 30, i.e., the highest one of the faces of the heat-dissipating member 30 in the +Z direction, serves as an element-mounting surface 38, on which the semiconductor 50 is mounted. In the top view of the semiconductor package 10, the element-mounting surface 38 is positioned in the through hole 21 of the substrate body 20. In FIG. 2, the element-mounting surface 38 and the semiconductor 50 that are positioned in the through hole 21 of the substrate body 20 in top view are hatched in the same manner as in the sectional view illustrated in FIG. 1. The metallic material forming the heat-dissipating member 30 may contain any of the following, for example: copper, aluminum, gold, and silver. In view of enhancing the heat-dissipating characteristic of the heat-dissipating member 30, the heat-dissipating member 30 desirably contains at least one of copper and aluminum, which each have relatively high thermal conductivity. Copper is more desirable as the material for the heat-dissipating member 30.

Figure 4:
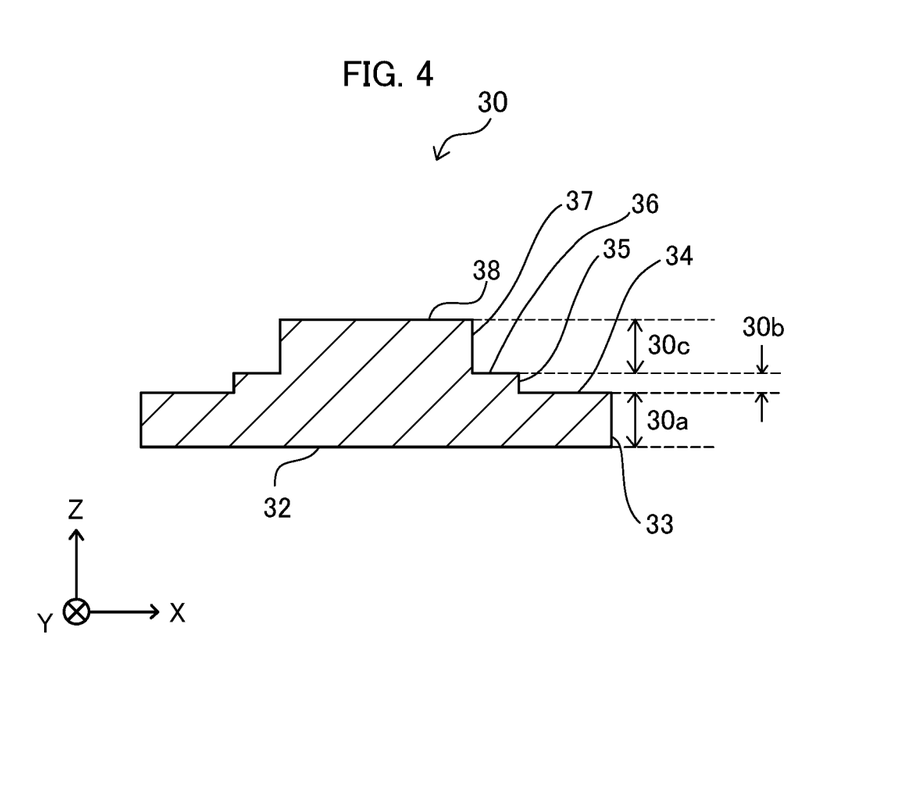
FIG. 4 is a sectional view of a heat-dissipating member, schematically illustrating a configuration thereof.

FIG. 4 is a sectional view of the heat-dissipating member 30, schematically illustrating a configuration thereof in the same section as in FIG. 1. The heat-dissipating member 30 includes three layers: a first heat-dissipating layer 30a, a second heat-dissipating layer 30b, and a third heat-dissipating layer 30c, which are stacked one on top of another in the listed order in the +Z direction. The three layers each extend horizontally (in an X-Y plane). The three layers are concentric in top view, with the outline shapes thereof decreasing in order of the first heat-dissipating layer 30a, the second heat-dissipating layer 30b, and the third heat-dissipating layer 30c.

The first heat-dissipating layer 30a includes a heat-dissipating-member back face 32, an outer lateral face 33, and a third planar portion 34. The heat-dissipating-member back face 32 forms the back face of the heat-dissipating member 30. The outer lateral face 33 extends in the Z direction. The third planar portion 34 extends in an X-Y plane and forms the front face of the first heat-dissipating layer 30a on the +Z side. The second heat-dissipating layer 30b includes a riser portion 35 and a fourth planar portion 36. The riser portion 35 extends in the Z direction and forms an outer lateral face of the second heat-dissipating layer 30b. The fourth planar portion 36 extends in an X-Y plane and forms the front face of the second heat-dissipating layer 30b on the +Z side. The third heat-dissipating layer 30c includes a riser portion 37 and the element-mounting surface 38. The riser portion 37 extends in the Z direction and forms an outer lateral face of the third heat-dissipating layer 30c. The element-mounting surface 38 extends in an X-Y plane and forms the front face of the third heat-dissipating layer 30c on the +Z side. The riser portion 35 extends upward (in the +Z direction) from the third planar portion 34, i.e., the front face of the heat-dissipating member 30, and is also referred to as "second riser portion".

The joining agent 40 joins the back face of the substrate body 20 that is oriented downward and the front face of the heat-dissipating member 30 that is oriented upward to each other. Specifically, the joining agent 40 is placed in a space enclosed by the first planar portion 24 forming the back face of the substrate body 20, the first riser portion (the riser portion 25), the third planar portion 34 forming the front face of the heat-dissipating member 30, and the second riser portion (the riser portion 35), and joins the substrate body 20 and the heat-dissipating member 30 to each other. The space is hereinafter referred to as "joining-agent-placing space". Referring to FIGS. 1 to 4, the first riser portion (the riser portion 25) of the substrate body 20 overlaps the third planar portion 34 of the heat-dissipating member 30 in top view. Furthermore, the second riser portion (the riser portion 35) of the heat-dissipating member 30 overlaps the first planar portion 24 of the substrate body 20 in top view. In FIG. 2, the outer perimeter and the inner perimeter of the joining-agent-placing space are illustrated by one-dot chain lines. The joining agent 40 may be, for example, silver solder or any other filler metal or solder material that contains gold, copper, tin, aluminum, or the like. In this specification, the term "filler metal" encompasses solder materials having relatively low melting points. The material for the joining agent 40 may be determined according to need, considering the materials for the substrate body 20 and the heat-dissipating member 30.

The semiconductor 50 may be, for example, a light-emitting component such as a light-emitting diode (LED) or an electronic component such as an integrated-circuit (IC) chip. The semiconductor 50 is electrically connected to a control device with a wire (not illustrated). The control device is provided on the outside of the semiconductor package 10. The semiconductor 50 according to the present embodiment projects further in the +Z direction than the substrate front face 22 of the substrate body 20 but does not necessarily need to project in the +Z direction.

(A-2) Method of Manufacturing Semiconductor Package

A method of manufacturing the semiconductor package 10 is outlined as follows. First, a substrate body 20, a heat-dissipating member 30, and a joining agent 40 are prepared.

If a ceramic material is used for making the substrate body 20, a known method such as sheet lamination or press-forming may be employed. The heat-dissipating member 30 may be obtained by, for example, pressing a metal plate. The joining agent 40 is obtained by forming filler metal into a frame-shaped plate with the outer and inner perimeters each defining a rectangle in top view. The size of the rectangle defined by the outer perimeter of the joining agent 40 is substantially the same as or slightly smaller than the size of a rectangle defined by the top-view outline of the first riser portion (the riser portion 25) of the substrate body 20. The size of the rectangle defined by the inner perimeter of the joining agent 40 is substantially the same as or slightly greater than the size of a rectangle defined by the top-view outline of the second riser portion (the riser portion 35) of the heat-dissipating member 30. The joining agent 40 according to the present embodiment not only joins the substrate body 20 and the heat-dissipating member 30 to each other but also contributes to the positioning of the substrate body 20 and the heat-dissipating member 30 with respect to each other, as to be described below. Therefore, the size of the joining agent 40 may be determined such that the joining function and the positioning function are to be achieved, considering the dimensional accuracy in the manufacturing process and other relevant factors.

To manufacture a semiconductor package 10, the substrate body 20 and the heat-dissipating member 30 are mated to each other such that the back face of the substrate body 20 and the front face of the heat-dissipating member 30 are positioned face to face, with the joining agent 40 being placed in the space (the joining-agent-placing space) enclosed by the first planar portion 24 forming the back face of the substrate body 20, the first riser portion (the riser portion 25), the third planar portion 34 forming the front face of the heat-dissipating member 30, and the second riser portion (the riser portion 35). In this process, the riser portion 25 of the substrate body 20 is fitted to the outer perimeter of the joining agent 40, and the riser portion 35 of the heat-dissipating member 30 is fitted to the inner perimeter of the joining agent 40. That is, the joining agent 40 is held between the riser portion 25 and the riser portion 35. Thus, the substrate body 20 and the heat-dissipating member 30 are positioned with respect to each other.

Subsequently, the joining agent 40, which is filler metal, is melted with heat, whereby the substrate body 20 and the heat-dissipating member 30 are joined to each other. The filler metal melted with heat spreads in the joining-agent-placing space and joins the substrate body 20 and the heat-dissipating member 30 to each other at the first planar portion 24 (see FIG. 3) of the substrate body 20 and the third planar portion 34 (see FIG. 4) of the heat-dissipating member 30. Subsequently, a semiconductor 50 is mounted on the element-mounting surface 38.

In the semiconductor package 10 according to the present embodiment that is configured as above, the back face of the substrate body 20 has the first riser portion (the riser portion 25), the front face of the heat-dissipating member 30 has the second riser portion (the riser portion 35), and the substrate body 20 and the heat-dissipating member 30 are joined to each other with the joining agent 40 placed in the joining-agent-placing space defined between the two riser portions. Therefore, the joining agent 40 melted with heat is allowed to spread within the joining-agent-placing space. Such a space in which the joining agent 40 is allowed to spread reduces the probability that the melted joining agent 40 may spread into other areas between the substrate body 20 and the heat-dissipating member 30. Consequently, the probability that the melted joining agent 40 may leak to the front or back face of the semiconductor package 10 is reduced.

Specifically, for example, the above configuration reduces the probability that the melted joining agent 40 may run up through the gap between the inner peripheral face 23 of the substrate body 20 and the riser portion 37 of the heat-dissipating member 30 (see FIGS. 3 and 4) and leak to the front face of the semiconductor package 10, and the probability that the melted joining agent 40 may run down through the gap between the riser portion 27 of the substrate body 20 and the outer lateral face 33 of the heat-dissipating member 30 (see FIGS. 3 and 4) and leak to the back face of the semiconductor package 10.

Figure 5:
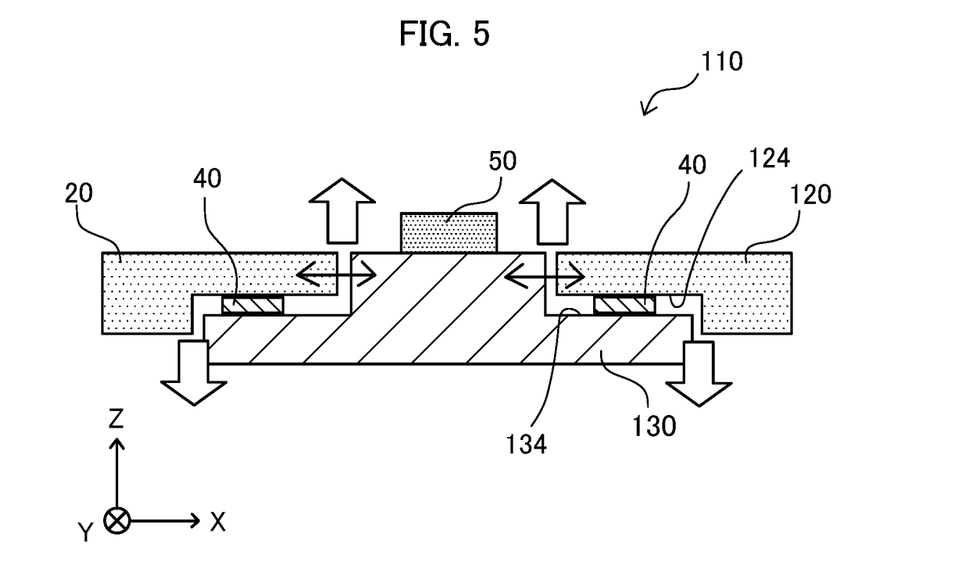
FIG. 5 is a sectional view of a semiconductor package according to a comparative example, schematically illustrating a configuration thereof.

FIG. 5 is a sectional view of a semiconductor package 110 according to a comparative example, schematically illustrating a configuration thereof in the same manner as in FIG. 1. The comparative example is different from the semiconductor package 10 according to the present embodiment in that the semiconductor package 110 includes a substrate body 120, which does not include the first riser portion; and a heat-dissipating member 130, which does not include the second riser portion. The semiconductor package 110 includes a planar portion 124, which forms a part of the back face of the substrate body 120 on the −Z side; and a planar portion 134, which forms a part of the front face of the heat-dissipating member 130 on the +Z side. The planar portion 124 and the planar portion 134 directly come into contact with each other unless the joining agent 40 is placed therebetween. In such a configuration, when the joining agent 40 placed between the planar portion 124 and the planar portion 134 is melted, the joining agent 40 spreads between the surfaces of the substrate body 120 and the heat-dissipating member 130 that come into contact with each other. Eventually, the melted joining agent 40 may leak to the front or back face of the semiconductor package 110. In FIG. 5, how the melted joining agent 40 may leak to the front or back face of the semiconductor package 110 is illustrated with white arrows. To prevent the melted joining agent 40 from leaking to the front or back face of the semiconductor package 110, high accuracy is required in forming the substrate body 120, the heat-dissipating member 130, and the joining agent 40, which tends to be difficult to achieve. In contrast, the semiconductor package 10 according to the present embodiment originally has the above-described joining-agent-placing space that allows the melted joining agent 40 to spread therein. Hence, the joining agent 40 tends to stay within the joining-agent-placing space. Thus, the probability that the joining agent 40 may leak to the front or back face of the semiconductor package 10 is reduced.

Note that the leakage of the joining agent 40 to the front or back face of the semiconductor package 10 may be allowed in some locations and to some extent unless the leakage adversely affects the mounting of the semiconductor 50 onto the element-mounting surface 38 and the mounting of the semiconductor package 10 onto a motherboard. Even in such a case, since the joining agent 40 is placed in the joining-agent-placing space for reducing the probability of leakage thereof to the front or back face of the semiconductor package 10, the probability of excessive leakage is low.

In the process of joining by heating, the joining-agent-placing space does not necessarily need to be entirely filled with the joining agent 40. The joining-agent-placing space in the finished semiconductor package 10 may have air gaps where the joining agent 40 is absent. As long as the substrate body 20 and the heat-dissipating member 30 are assuredly joined to each other, the joining agent 40 may be of a volume that is smaller than the full capacity of the joining-agent-placing space.

In the semiconductor package 10 according to the present embodiment, the joining agent 40 that is placed in the joining-agent-placing space but is yet to be melted has such a shape as to be held between the first riser portion (the riser portion 25) of the substrate body 20 and the second riser portion (the riser portion 35) of the heat-dissipating member 30. Such a shape increases the accuracy in the positioning between the substrate body 20 and the heat-dissipating member 30. In the comparative example illustrated in FIG. 5 in which the first riser portion and the second riser portion are not provided, the joining agent 40 that is placed between the substrate body 120 and the heat-dissipating member 130 but is yet to be melted is not in contact at the lateral faces thereof with the substrate body 120 and the heat-dissipating member 130. Therefore, the joining agent 40 does not contribute to the positioning between the substrate body 120 and the heat-dissipating member 130. As illustrated in FIG. 5, the substrate body 120 and the heat-dissipating member 130 may be displaced with respect to each other in an X-Y plane as indicated by double-headed arrows. In contrast, in the semiconductor package 10 according to the present embodiment, the first riser portion and the second riser portion that hold the joining agent 40 therebetween contribute to the positioning between the substrate body 20 and the heat-dissipating member 30. In the present embodiment, the first riser portion (the riser portion 25) of the substrate body 20 and the second riser portion (the riser portion 35) of the heat-dissipating member 30 are each a surface extending in the Z direction. Alternatively, the two riser portions may each have another shape. For example, at least one of the first riser portion and the second riser portion may be tilted with respect to the Z direction. Such a configuration is also acceptable as long as the positioning between the substrate body 20 and the heat-dissipating member 30 is achieved by causing the first riser portion and the second riser portion to be in contact with the joining agent 40 that is yet to be melted, i.e., by holding the joining agent 40 between the two riser portions.

In the present embodiment, as described above, the substrate body 20 and the heat-dissipating member 30 are positioned with respect to each other by using the joining agent 40 that is yet to be melted. Therefore, the substrate body 20 and the heat-dissipating member 30 each do not need to include any structure for the positioning thereof in an X-Y plane. Accordingly, the lateral face (the surface extending in the Z direction) of the substrate body 20 and the lateral face (the surface extending in the Z direction) of the heat-dissipating member 30 are allowed to be spaced apart from each other. In other words, it is possible to provide a space between an inner lateral face of the substrate body 20 and an outer lateral face of the heat-dissipating member 30 that are positioned face to face with each other: specifically, between the inner peripheral face 23 of the substrate body 20 and the riser portion 37 of the heat-dissipating member 30, and between the riser portion 27 of the substrate body 20 and the outer lateral face 33 of the heat-dissipating member 30. When the joining agent 40 is heated in the joining process, the heat-dissipating member 30, which is made of metal and has a relatively greater coefficient of thermal expansion, expands to a greater extent than the substrate body 20.

Accordingly, the outer lateral face of the heat-dissipating member 30 expands toward the inner lateral face of the substrate body 20. In the present embodiment, as described above, the substrate body 20 and the heat-dissipating member 30 are spaced apart from each other. Such a configuration reduces the probability that the lateral face of the substrate body 20 and the lateral face of the heat-dissipating member 30 come into contact with each other even when the substrate body 20 and the heat-dissipating member 30 undergo thermal expansion. Consequently, for example, it is less probable that a stress may be applied to the substrate body 20 from the heat-dissipating member 30 coming into contact with the substrate body 20 and may damage the substrate body 20.

In the process of joining the substrate body 20 and the heat-dissipating member 30 to each other by heating, since the coefficient of thermal expansion is different between the substrate body 20 and the heat-dissipating member 30, the distance between the first riser portion (the riser portion 25) of the substrate body 20 and the second riser portion (the riser portion 35) of the heat-dissipating member 30 is reduced. In the joining process, the joining agent 40 that is present between the first riser portion and the second riser portion is in the melted state. Therefore, it is less probable that a stress may be generated between the first riser portion of the substrate body 20 and the second riser portion of the heat-dissipating member 30 that expand toward each other.

B. Second Embodiment

Figure 6:
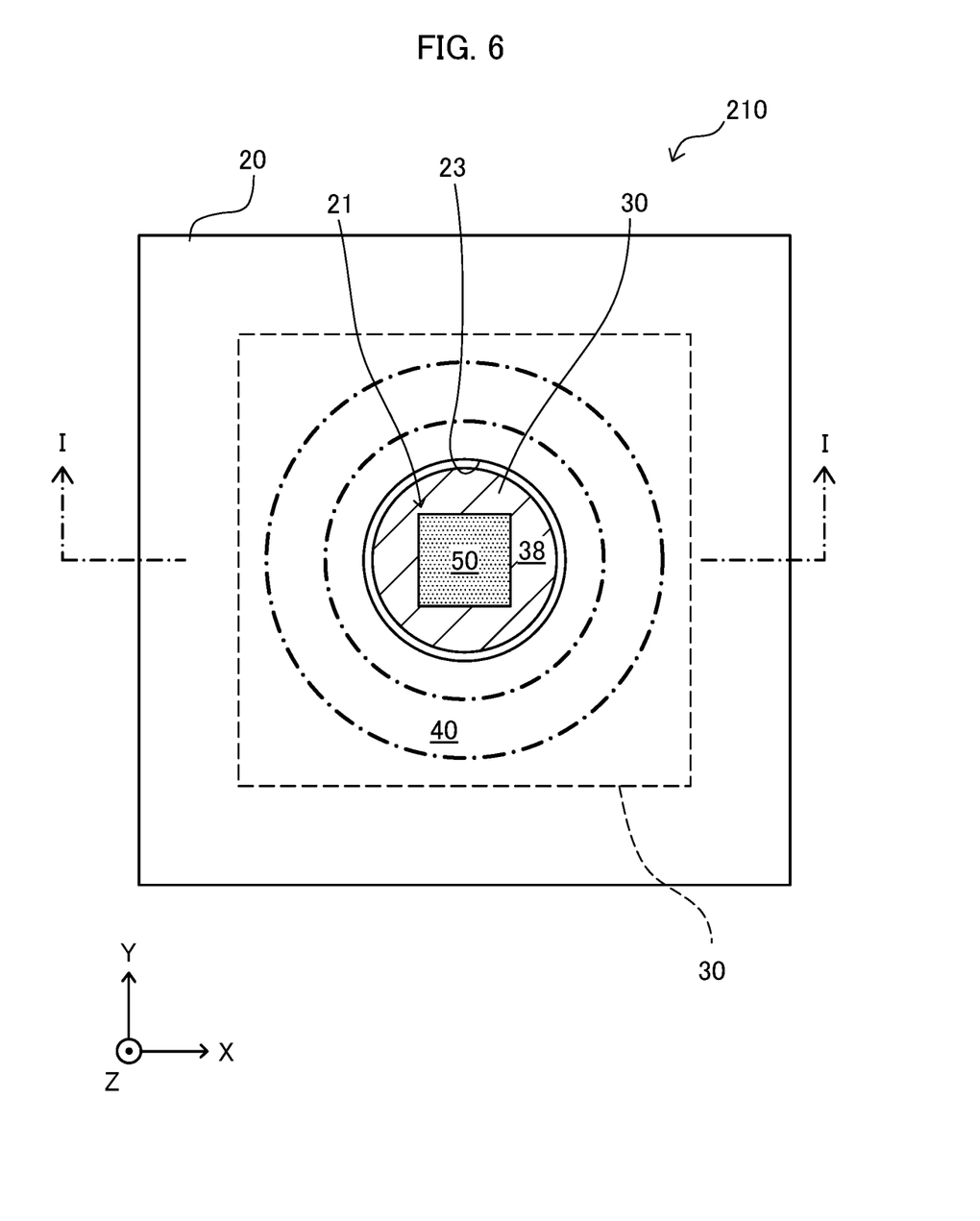
FIG. 6 is a plan view of a semiconductor package according to a second embodiment, schematically illustrating an appearance thereof.

FIG. 6 is a plan view of a semiconductor package 210 according to a second embodiment, schematically illustrating an appearance thereof in the same manner as in FIG. 2. Elements of the semiconductor package 210 according to the second embodiment that are the same as those of the semiconductor package 10 according to the first embodiment are denoted by corresponding ones of the reference signs used in the first embodiment. In a section taken along line I-I illustrated in FIG. 6, the semiconductor package 210 according to the second embodiment has the same shape as the semiconductor package 10 according to the first embodiment illustrated in FIG. 1, and the substrate body 20 and the heat-dissipating member 30 also have the same shapes as those illustrated in FIG. 3 and FIG. 4, respectively.

In the top view of the semiconductor package 210, as illustrated in FIG. 6, the outer and inner perimeters of the joining agent 40, the inner peripheral face 23 defining the through hole 21 of the substrate body 20, and the outer perimeter of the element-mounting surface 38 of the heat-dissipating member 30 are all circular. Furthermore, although not illustrated in FIG. 6, the riser portion 25 (see FIG. 3) serving as the first riser portion included in the substrate body 20 and the riser portion 35 (see FIG. 4) serving as the second riser portion included in the heat-dissipating member 30, which form the structure of holding the joining agent 40 that is yet to be melted, also have circular shapes in top view. Regardless of the top-view shapes of the joining agent 40 and the joining-agent-placing space described above, the same advantageous effects as in the first embodiment are produced by placing the joining agent 40 in the joining-agent-placing space defined between the first riser portion and the second riser portion.

C. Third Embodiment

Figure 7:
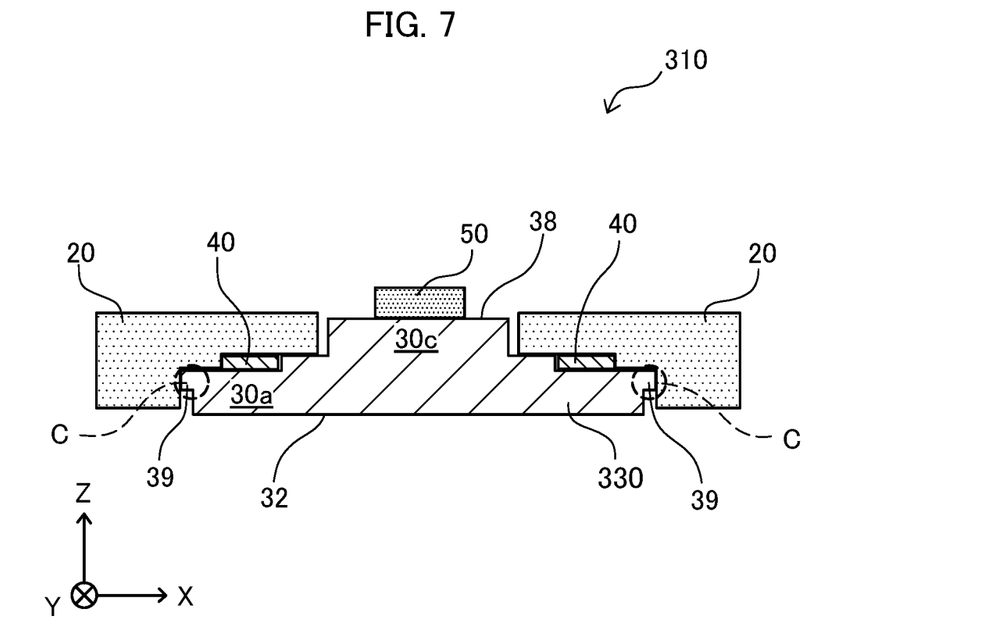
FIG. 7 is a sectional view of a semiconductor package according to a third embodiment, schematically illustrating a configuration thereof.

FIG. 7 is a sectional view of a semiconductor package 310 according to a third embodiment, schematically illustrating a configuration thereof in the same manner as in FIG. 1. Elements of the semiconductor package 310 according to the third embodiment that are the same as those of the semiconductor package 10 according to the first embodiment are denoted by corresponding ones of the reference signs used in the first embodiment.

The semiconductor package 310 according to the third embodiment is different from the semiconductor package 10 according to the first embodiment in that the semiconductor package 310 includes a heat-dissipating member 330 in replacement of the heat-dissipating member 30. The heat-dissipating member 330 includes a projection 39, which projects outward from the outer perimeter of the first heat-dissipating layer 30*a*. When the substrate body 20 and the heat-dissipating member 330 are mated to each other, the projection 39 comes into contact with the riser portion 27 (see FIG. 3) that forms the inner peripheral wall of the substrate body 20. In FIG. 7, the area where the projection 39 is in contact with the inner peripheral wall of the substrate body 20 is encircled by a broken line and is denoted as C. Thus, the substrate body 20 and the heat-dissipating member 330 are positioned with respect to each other by using the projection 39 provided to the heat-dissipating member 330. The projection 39 may extend over the entirety of the outer perimeter of the first heat-dissipating layer 30*a* of the heat-dissipating member 330, or may be provided at a single or each of a plurality of positions on the outer perimeter of the first heat-dissipating layer 30*a*. The number of projections 39 and the shape of each projection 39 may be determined appropriately such that the stress to be applied to the substrate body 20 at the point of contact with the projection 39 when heating is performed in the joining process falls within a tolerable range. Considering the reduction in the stress to be applied to the substrate body 20 at the point of contact with the projection 39 when the joining agent 40 is heated in the joining process, the projection 39 is desirably provided only in some part of the outer perimeter of the first heat-dissipating layer 30*a* and in a number that is set as small as possible but such that the contribution of the projection 39 to the positioning is not lost. For example, the projection 39 may be provided at each of two or three separate positions on the outer perimeter of the first heat-dissipating layer 30*a*.

In such a configuration as well, the same advantageous effects as in the first embodiment are produced by placing the joining agent 40 in the joining-agent-placing space. Furthermore, employing the heat-dissipating member 330 including the projection 39 provides an additional reference for the positioning. Therefore, the accuracy in the positioning between the substrate body 20 and the heat-dissipating member 330 is higher than in a case where the positioning is achieved by using the joining agent 40 alone.

While the semiconductor package 310 according to the third embodiment illustrated in FIG. 7 employs a configuration in which the projection 39 serving as a reference for the positioning is provided at the outer perimeter of the first heat-dissipating layer 30*a* of the heat-dissipating member 330, another configuration may be employed. For example, the projection serving as a reference for the positioning may be provided on the outer perimeter of the third heat-dissipating layer 30*c* of the heat-dissipating member 330 in such a manner as to come into contact with the inner peripheral face 23 (see FIG. 3) of the substrate body 20. Alternatively, the projection serving as a reference for the positioning may be provided to the substrate body 20. For example, the projection may be provided on the riser portion 27 (see FIG. 3) forming the inner peripheral wall of the substrate body 20 in such a manner as to come into contact with the outer lateral face (see FIG. 4) of the heat-dissipating member 30. Alternatively, the projection may be provided on the inner peripheral face 23 (see FIG. 3) of the substrate body 20 in such a manner as to come into contact with the riser portion 37 (see FIG. 4) of the heat-dissipating member 30. Such configurations also produce the effect of increasing the accuracy in the positioning between the substrate body 20 and the heat-dissipating member 30.

D. Fourth Embodiment

While the first to third embodiments each employ a configuration in which the joining agent 40 to be placed in the joining-agent-placing space before the substrate body and the heat-dissipating member are joined to each other is a frame-shaped plate having a rectangular or circular top-view shape, the joining agent 40 may have another shape. An exemplary configuration employing a joining agent having a shape other than the frame shape will be described as a fourth embodiment.

Figure 8:
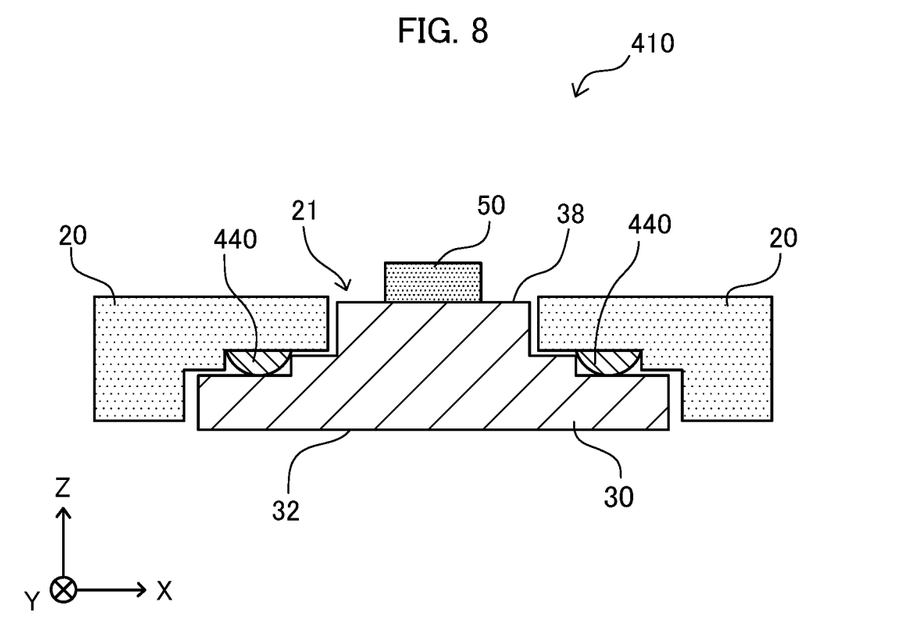
FIG. 8 is a sectional view of a semiconductor package according to a fourth embodiment, schematically illustrating a configuration thereof.
Figure 9:
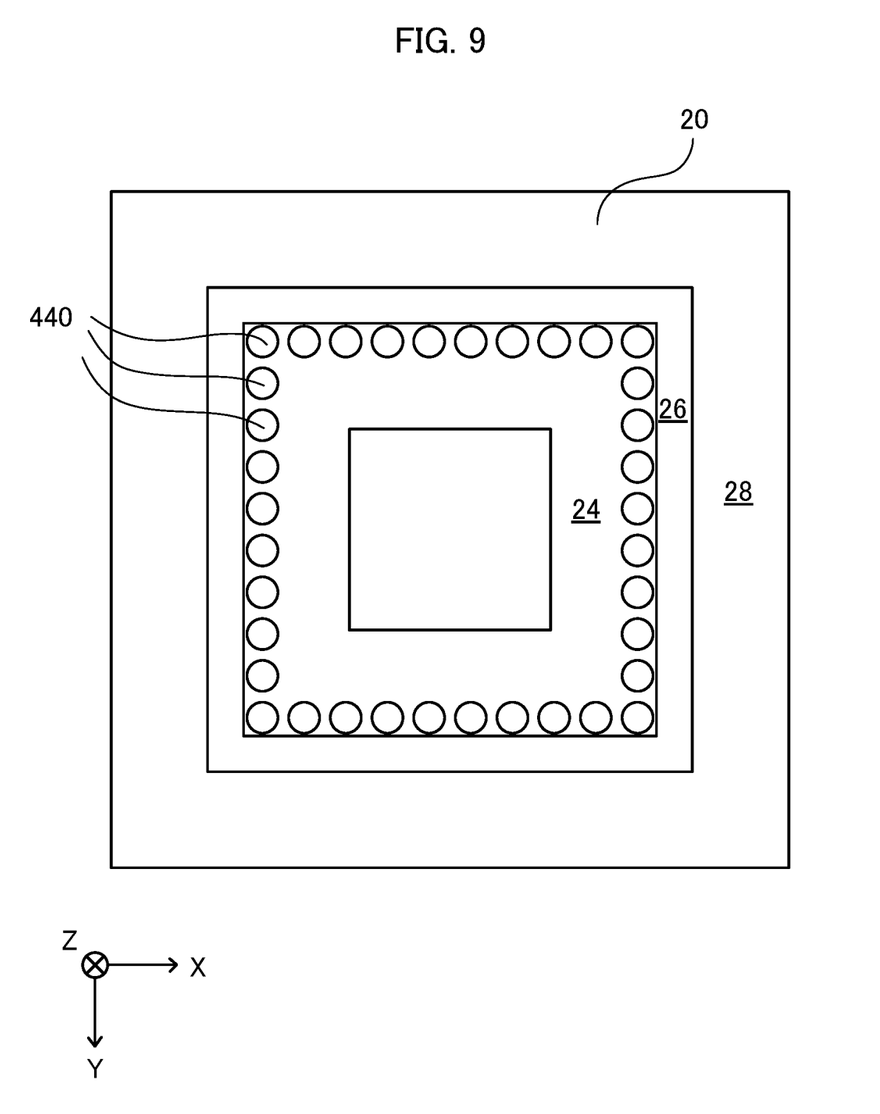
FIG. 9 is a bottom view of a substrate body according to the fourth embodiment, schematically illustrating an appearance thereof.

FIG. 8 is a sectional view of a semiconductor package 410 according to the fourth embodiment, schematically illustrating a configuration thereof in the same manner as in FIG. 1. FIG. 9 is a bottom view (seen in the +Z direction) of a substrate body 20 included in the semiconductor package 410. Elements of the semiconductor package 410 according to the fourth embodiment that are the same as those of the semiconductor package 10 according to the first embodiment are denoted by corresponding ones of the reference signs used in the first embodiment.

The semiconductor package 410 according to the fourth embodiment includes a joining agent 440 in replacement of the joining agent 40 of the semiconductor package 10 according to the first embodiment. The joining agent 440 illustrated in FIGS. 8 and 9 is yet to be melted with heat. As illustrated in FIGS. 8 and 9, the semiconductor package 410 that is yet to undergo the process of joining the substrate body 20 and the heat-dissipating member 30 includes a plurality of semispherical pieces of joining agent 440. As illustrated in FIG. 9, the plurality of pieces of joining agent 440 are provided on the first planar portion 24 forming the back face of the substrate body 20 and along the first riser portion (the riser portion 25) extending between the first planar portion 24 and the second planar portion 26. The pieces of joining agent 440 are obtained as follows, for example. A metal coating layer is formed over an area, inclusive of the first planar portion 24, of the back face of the substrate body 20. Then, a material for the joining agent 40, such as filler metal, is applied onto the metal coating layer through a dispenser or the like in such a manner as to form dots.

Such a configuration also produces the effect of reducing the probability that the melted joining agent 440 may leak to the front or back face of the semiconductor package 410, as with the case of the first embodiment, by joining the substrate body 20 and the heat-dissipating member 30 to each other with the joining agent 440 placed in the joining-agent-placing space. Furthermore, if the joining agent 440 that is yet to be melted is held between the first riser portion (the riser portion 25) of the substrate body 20 and the second riser portion (the riser portion 35) of the heat-dissipating member 30, the accuracy in the positioning between the substrate body 20 and the heat-dissipating member 30 is increased.

The shape of the plurality of pieces of joining agent 440 to be placed in the joining-agent-placing space may be any of various shapes, including a spherical shape, a rectangular prism shape, a cubic shape, and a round columnar shape, in addition to the above semispherical shape. The plurality of pieces of joining agent 440 may be fixed in advance to either the back face of the substrate body 20 or the front face of the heat-dissipating member 30. Alternatively, the plurality of pieces of joining agent 440 may be placed at a location corresponding to the joining-agent-placing space in a process of assembling the semiconductor package 410, without being fixed in advance to the substrate body 20 or the heat-dissipating member 30.

E. Fifth Embodiment

Figure 10:
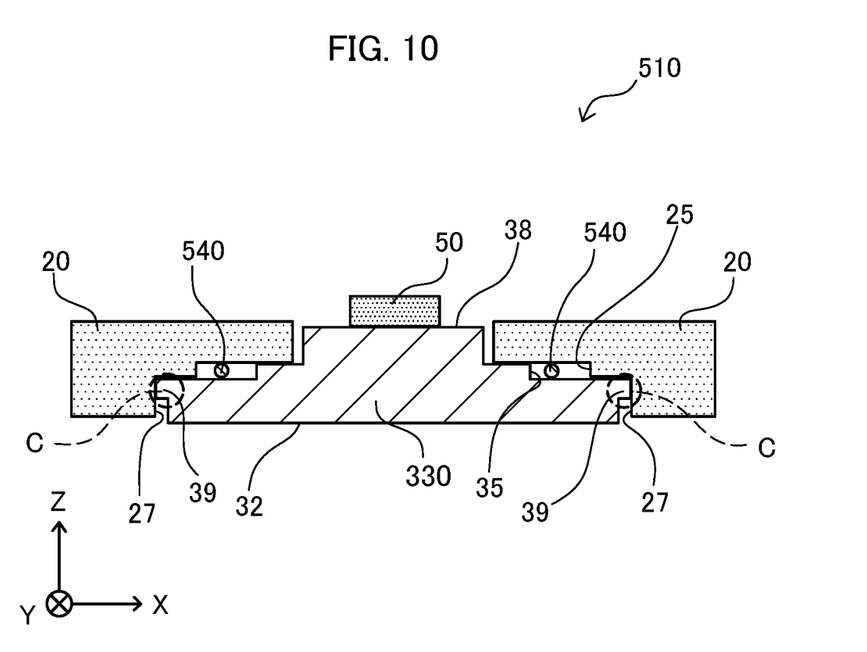
FIG. 10 is a sectional view of a semiconductor package according to a fifth embodiment, schematically illustrating a configuration thereof.

FIG. 10 is a sectional view of a semiconductor package 510 according to a fifth embodiment, schematically illustrating a configuration thereof in the same manner as in FIG. 1. Elements of the semiconductor package 510 according to the fifth embodiment that are the same as those of the semiconductor package 10 according to the first embodiment are denoted by corresponding ones of the reference signs used in the first embodiment.

The semiconductor package 510 according to the fifth embodiment includes a joining agent 540 in replacement of the joining agent 40 according to the first embodiment, and the heat-dissipating member 330 according to the third embodiment in replacement of the heat-dissipating member 30 according to the first embodiment. The joining agent 540 illustrated in FIG. 10 is yet to be melted in the joining process. As illustrated in FIG. 10, the sectional area of the joining agent 540 that is yet to be melted is smaller than the sectional area of the joining-agent-placing space. Therefore, the joining agent 540 placed in the joining-agent-placing space is not in contact with the first riser portion (the riser portion 25) of the substrate body 20 and the second riser portion (the riser portion 35) of the heat-dissipating member 330. In the fifth embodiment, the substrate body 20 and the heat-dissipating member 330 are positioned with respect to each other by causing the projection 39 of the heat-dissipating member 330 to be in contact with the riser portion 27 forming the inner peripheral wall of the substrate body 20.

Even in such a configuration in which the joining agent 540 does not contribute to the positioning between the substrate body 20 and the heat-dissipating member 330, the probability that the melted joining agent 540 may leak to the front or back face of the semiconductor package 510 is reduced, as with the case of the first embodiment, by placing the joining agent 540 in the joining-agent-placing space. The structure for achieving the positioning between the substrate body 20 and the heat-dissipating member 330 in the configuration in which the joining agent 540 does not contribute to the positioning between the substrate body 20 and the heat-dissipating member 330 may be any of various structures, inclusive of the structure employing the projection 39 provided to the heat-dissipating member 330 as illustrated in FIG. 10.

F. Sixth Embodiment

Figure 11:
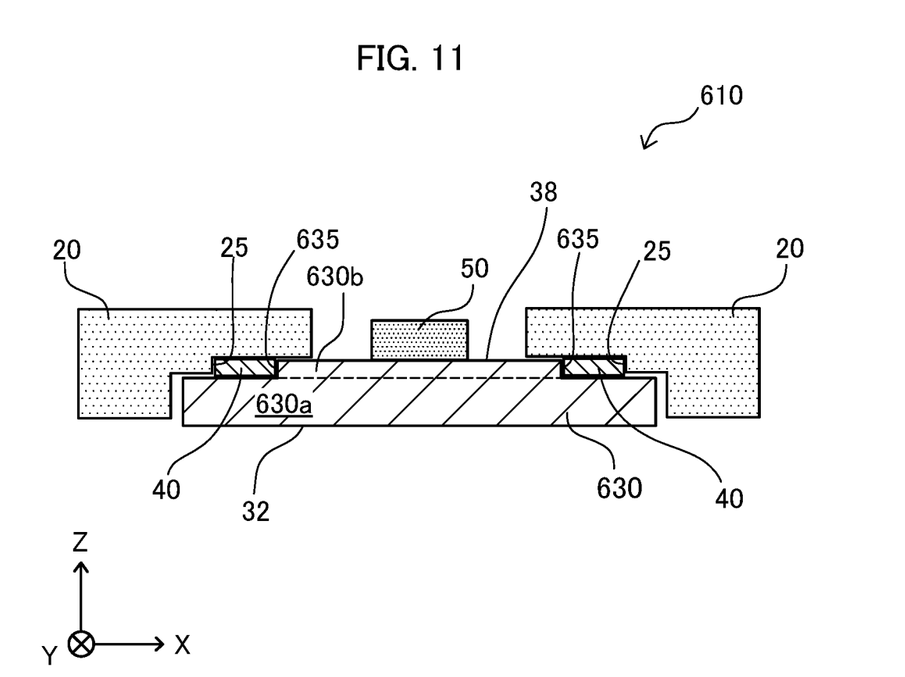
FIG. 11 is a sectional view of a semiconductor package according to a sixth embodiment, schematically illustrating a configuration thereof.

FIG. 11 is a sectional view of a semiconductor package 610 according to a sixth embodiment, schematically illustrating a configuration thereof in the same manner as in FIG. 1. Elements of the semiconductor package 610 according to the sixth embodiment that are the same as those of the semiconductor package 10 according to the first embodiment are denoted by corresponding ones of the reference signs used in the first embodiment.

The semiconductor package 610 according to the sixth embodiment includes a heat-dissipating member 630 in replacement of the heat-dissipating member 30 according to the first embodiment. The heat-dissipating member 630 includes a first heat-dissipating layer 630a and a second heat-dissipating layer 630b. The first heat-dissipating layer 630a and the second heat-dissipating layer 630b are two layers each extending horizontally (in an X-Y plane) and are placed one on top of the other in the listed order in the +Z direction to form the heat-dissipating member 630. In the heat-dissipating member 630, a riser portion 635 forms the outer lateral face of the second heat-dissipating layer 630b, which has the element-mounting surface 38. The riser portion 635 serves as the second riser portion for providing the joining-agent-placing space.

In such a configuration as well, the same advantageous effects as in the first embodiment are produced by placing the joining agent 40 in the joining-agent-placing space defined between the first riser portion (the riser portion 25) of the substrate body 20 and the second riser portion (the riser portion 635) of the heat-dissipating member 630. Regardless of the number of riser portions included in each of the heat-dissipating member and the substrate body, the above advantageous effects are produced by placing the joining agent 40 in the joining-agent-placing space defined between the first riser portion, which is one of the riser portions included in the substrate body, and the second riser portion, which is one of the riser portions included in the heat-dissipating member.

G. Other Embodiments

While the above embodiments each employ filler metal as the joining agent, another material such as adhesive may be employed as the joining agent. As long as any joining agent is placed in the joining-agent-placing space prior to the process of joining the substrate body and the heat-dissipating member, the effect of reducing the probability of leakage of the joining agent 40 to the front or back face of the semiconductor package is produced. If the joining agent that is yet to be melted is rigid enough to bear the stress applied thereto in the positioning process, the accuracy in the positioning between the substrate body and the heat-dissipating member is increased by causing the first riser portion of the substrate body and the second riser portion of the heat-dissipating member to be in contact with the joining agent that is yet to be melted.

The present disclosure is not limited to the above embodiments and may be embodied in various other ways without departing from the essence thereof. For example, those technical features of the above embodiments that correspond to the technical features of the embodiment described in Summary of Invention may be interchanged or combined in any way to solve some or all of the problems described above or to achieve some or all of the advantageous effects described above. Furthermore, any of the technical features that are not described as essential in this specification may be omitted.

What is claimed is:

1. A semiconductor package comprising:
   a substrate body made of an insulating material and having a frame shape with a through hole; and
   a heat-dissipating member made of a metallic material and having a top face serving as an element-mounting surface, the element-mounting surface being positioned in the through hole,
   wherein a back face of the substrate body and a front face of the heat-dissipating member are joined to each other with a joining agent, the back face being oriented downward, the front face being oriented upward,
   wherein the substrate body includes a first riser portion extending downward from the back face,
   wherein the heat-dissipating member includes a second riser portion extending upward from the front face,
   wherein the joining agent is placed in a space enclosed by the back face, the first riser portion, the front face, and the second riser portion, and
   wherein the heat-dissipating member also includes a planar portion oriented upward and extending inward from the second riser portion, and a third riser portion extending upward from the planar portion to the element-mounting surface.

2. The semiconductor package according to claim 1, wherein an inner lateral face of the substrate body and an outer lateral face of the heat-dissipating member that are positioned face to face with each other are spaced apart from each other.

3. The semiconductor package according to claim 1, wherein the joining agent is filler metal.

4. The semiconductor package according to claim 2, wherein the joining agent is filler metal.

5. The semiconductor package according to claim 1, wherein the substrate body is made of alumina, and wherein the heat-dissipating member is made of copper.

6. The semiconductor package according to claim 2, wherein the substrate body is made of alumina, and wherein the heat-dissipating member is made of copper.

7. The semiconductor package according to claim 3, wherein the substrate body is made of alumina, and wherein the heat-dissipating member is made of copper.

8. The semiconductor package according to claim 4, wherein the substrate body is made of alumina, and wherein the heat-dissipating member is made of copper.

* * * * *